(12) United States Patent
Kim et al.

(10) Patent No.: US 8,546,270 B2
(45) Date of Patent: Oct. 1, 2013

(54) ATOMIC LAYER DEPOSITION APPARATUS

(71) Applicant: Samsung Electronics Co., Ltd., Suwon-si (KR)

(72) Inventors: Ki-Hyun Kim, Yongin-si (KR); Ki-Vin Im, Seongnam-si (KR); Hoon-Sang Choi, Seoul (KR); Moon-Hyeong Han, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 0 days.

(21) Appl. No.: 13/780,560

(22) Filed: Feb. 28, 2013

(65) Prior Publication Data

US 2013/0178070 A1    Jul. 11, 2013

Related U.S. Application Data

(62) Division of application No. 12/356,999, filed on Jan. 21, 2009, now Pat. No. 8,394,201.

(30) Foreign Application Priority Data

Jan. 24, 2008    (KR) .................. 10-2008-0007344

(51) Int. Cl.
*H01L 21/469*    (2006.01)
*B05D 5/12*    (2006.01)
*C23C 16/455*    (2006.01)
*C23C 16/458*    (2006.01)
*C23C 16/12*    (2006.01)
*C23C 16/14*    (2006.01)

(52) U.S. Cl.
USPC ........... 438/758; 438/688; 438/765; 438/769; 427/126.3; 427/126.4; 427/255.28; 427/255.36; 427/255.34; 118/715; 118/724; 118/725; 156/345.33; 156/345.51; 156/345.52

(58) Field of Classification Search
USPC ................. 427/126.3–126.4, 255.28, 255.36, 427/255.34
See application file for complete search history.

(56) References Cited

U.S. PATENT DOCUMENTS

| | | | | | |
|---|---|---|---|---|---|
| 4,062,318 | A | * | 12/1977 | Ban et al. ...................... | 118/725 |
| 4,132,567 | A | * | 1/1979 | Blackwood ........................ | 134/1 |
| 4,197,000 | A | * | 4/1980 | Blackwood ................... | 396/625 |
| 4,264,393 | A | * | 4/1981 | Gorin et al. .............. | 156/345.37 |
| 4,443,410 | A | * | 4/1984 | Zaferes ........................ | 118/729 |
| 4,651,674 | A | * | 3/1987 | Hayashi et al. ............... | 118/728 |
| 4,745,088 | A | * | 5/1988 | Inoue et al. ..................... | 117/98 |
| 4,980,204 | A | * | 12/1990 | Fujii et al. ...................... | 117/98 |
| 5,224,503 | A | * | 7/1993 | Thompson et al. .......... | 134/95.2 |
| 5,562,113 | A | * | 10/1996 | Thompson et al. .......... | 134/95.2 |

(Continued)

FOREIGN PATENT DOCUMENTS

| | | | | |
|---|---|---|---|---|
| JP | 58120510 | A | * | 7/1983 |
| JP | 61122194 | A | * | 6/1986 |
| JP | 07161656 | A | * | 6/1995 |

*Primary Examiner* — Rudy Zervigon
(74) *Attorney, Agent, or Firm* — F. Chau & Associates, LLC

(57) ABSTRACT

An atomic layer deposition apparatus and an atomic layer deposition method increase productivity. The atomic layer deposition apparatus includes a reaction chamber, a heater for supporting a plurality of semiconductor substrates with a given interval within the reaction chamber and to heat the plurality of semiconductor substrates and a plurality of injectors respectively positioned within the reaction chamber and corresponding to the plurality of semiconductor substrates supported by the heater. The plurality of injectors are individually swept above the plurality of semiconductor substrates to spray reaction gas.

4 Claims, 5 Drawing Sheets

(56) References Cited

U.S. PATENT DOCUMENTS

| | | | | |
|---|---|---|---|---|
| 5,738,128 | A * | 4/1998 | Thompson et al. | 134/95.2 |
| 5,879,458 | A * | 3/1999 | Roberson et al. | 118/715 |
| 5,980,687 | A * | 11/1999 | Koshimizu | 156/345.29 |
| 6,042,651 | A * | 3/2000 | Roberson et al. | 118/715 |
| 6,080,241 | A * | 6/2000 | Li et al. | 118/715 |
| 6,128,830 | A * | 10/2000 | Bettcher et al. | 34/404 |
| 6,164,297 | A * | 12/2000 | Kamikawa | 134/61 |
| 6,221,163 | B1 * | 4/2001 | Roberson et al. | 118/715 |
| 6,368,411 | B2 * | 4/2002 | Roberson et al. | 118/715 |
| 6,383,300 | B1 * | 5/2002 | Saito et al. | 118/715 |
| 6,413,884 | B1 * | 7/2002 | Moriyama | 438/784 |
| 6,896,737 | B1 * | 5/2005 | Sandhu | 118/715 |
| 7,271,096 | B2 * | 9/2007 | Sandhu | 438/680 |
| 7,305,999 | B2 * | 12/2007 | Henke et al. | 134/147 |
| 7,386,944 | B2 * | 6/2008 | Yi et al. | 34/527 |
| 7,402,213 | B2 * | 7/2008 | Verhaverbeke | 134/40 |
| 7,431,585 | B2 * | 10/2008 | Zhao et al. | 432/241 |
| 7,521,378 | B2 * | 4/2009 | Fucsko et al. | 438/781 |
| 7,534,730 | B2 * | 5/2009 | Ozaki et al. | 438/770 |
| 7,622,007 | B2 * | 11/2009 | Nakaiso | 118/725 |
| 7,629,256 | B2 * | 12/2009 | Hasper | 438/680 |
| 7,819,082 | B2 * | 10/2010 | Ohmi et al. | 118/723 MW |
| 7,871,938 | B2 * | 1/2011 | Ozaki et al. | 438/770 |
| 7,910,494 | B2 * | 3/2011 | Dip et al. | 438/770 |
| 7,968,441 | B2 * | 6/2011 | Xu | 438/530 |
| 8,084,369 | B2 * | 12/2011 | Ozaki et al. | 438/770 |
| 2001/0025605 | A1 * | 10/2001 | Nagakura | 118/715 |
| 2004/0187785 | A1 * | 9/2004 | Kishimoto et al. | 118/719 |
| 2005/0221552 | A1 * | 10/2005 | Kao et al. | 438/200 |
| 2005/0257890 | A1 * | 11/2005 | Park et al. | 156/345.35 |
| 2005/0287806 | A1 * | 12/2005 | Matsuura | 438/680 |
| 2006/0029735 | A1 * | 2/2006 | Ko | 427/248.1 |
| 2008/0160210 | A1 * | 7/2008 | Yang et al. | 427/534 |

* cited by examiner

ATOMIC LAYER DEPOSITION APPARATUS

CROSS-REFERENCE TO RELATED APPLICATIONS

This application is a divisional application of co-pending U.S. application Ser. No. 12/356,999 filed Jan. 21, 2009, which claims priority under 35 U.S.C. §119 from Korean Patent Application 10-2008-0007344, filed on Jan. 24, 2008, the disclosures of which are each hereby incorporated by reference herein in their entireties.

BACKGROUND

1. Technical Field

The present disclosure relates to semiconductor manufacturing apparatuses, and more particularly, to an atomic layer deposition apparatus and to a deposition method thereof for depositing an atomic layer on a semiconductor substrate.

2. Description of the Related Art

Recently, thin film manufacturing process are being precisely controlled below a nano-scale according to the higher integrated tendency of semiconductor devices. The thin film deposition process may thus require a deposition technology more enhanced than the previous physical vapor deposition method and chemical vapor deposition methods. One such technology which may satisfy the above requirement is atomic layer deposition technology.

The atomic layer deposition technology was first introduced in the name of 'Atomic layer epitaxy technology' by Suntola of Finland in the mid 1970s. In addition, the above-mentioned atomic layer deposition technology was first applied to a phosphor layer thin film deposition for an electroluminescent flat display device, but in the '90s the research and development for its application to a semiconductor process is being actively pursued.

The atomic layer deposition technology is a thin film deposition of a new concept using a chemical absorption and desorption through a saturated surface reaction of reaction material on the semiconductor substrate surface by individually separating reaction precursors and flowing them in a pulse type on the semiconductor substrate. Thus, a plurality of reaction precursors can form one layer of thin film during flowing with one cycle on the semiconductor substrate. Further, reaction material flowing on the semiconductor substrate may become three kinds or more. A portion of the reaction materials may be used as a necessary component growing the thin film, and the remaining portions may help a subsequent reaction by removing one or more ligands, thereby processing the substrate surface.

The single-type atomic layer deposition apparatus according to the conventional art, for which an atomic-layer thin film is formed on one semiconductor substrate by using the atomic layer deposition technology, is described in U.S. Pat. No. 6,812,157. But the single-type atomic layer deposition equipment has a low throughput since one semiconductor substrate should be singly provided into a chamber that supplies reaction precursors several times.

Further, to overcome the limitations of the above-mentioned single-type atomic layer deposition apparatus, an atomic layer deposition apparatus of a batch type stacking a plurality of semiconductor substrates has been developed. The atomic layer deposition apparatus of a batch type according to the conventional art is described in U.S. Pat. No. 6,916,374. The atomic layer deposition equipment of a batch type is provided to form respective thin films on the plurality of semiconductor substrates by using reaction materials sprayed through a side face of the plurality of semiconductor substrates stacked in a boat. But in the atomic layer deposition apparatus of a batch type, the thin film formed on the plurality of semiconductor substrates represents a deviation of thickness according to the supply direction of reaction material, thereby decreasing uniformity.

Therefore, in an attempt to solve the above-mentioned difficulty of the batch type atomic layer deposition apparatus in forming a thin film on a plurality of stacked semiconductor substrates through the atomic layer deposition technology, an atomic deposition equipment of a semi-batch type horizontally arraying a plurality of semiconductor substrates is being developed. The atomic layer deposition apparatus of the semi-batch type according to a conventional technology is described in U.S. Pat. No. 6,902,620. But, with the atomic layer deposition apparatus of the semi-batch type, the area of the disc to array a plurality of semiconductor substrates on one horizontal face thereof and a horizontal area of chamber storing the disc may increase. In addition, with the semi-batch type atomic layer deposition apparatus, it may be difficult to control the internal pressure of the chamber and a pollution source such as particles. As a result, the uniformity of thin film may decrease, thereby reducing a production yield.

As described above, the conventional atomic layer deposition equipment may have the following difficulties.

First, in the conventional atomic layer deposition equipment of a single type, throughput decreases as compared with the cost and time taken in performing an atomic layer deposition forming a thin film on one semiconductor substrate within one chamber, and thus the productivity yield may decrease.

Secondly, in the conventional atomic layer deposition equipment of a batch type, the uniformity of thin film based on the flow direction of reaction material sprayed through a side face of a plurality of semiconductor substrates stacked in a boat of a chamber decreases, thereby reducing the production yield.

Thirdly, in the conventional atomic layer deposition equipment of a semi-batch type, there may be a difficulty with the size of disc for supporting a plurality of semiconductor substrates when one plane surface increases and it is also may be difficult to control the internal pressure of chamber and a pollution source. As a result, the uniformity of thin film may decrease, thereby reducing the production yield.

SUMMARY

Exemplary embodiments of the invention may provide an atomic layer deposition equipment and an atomic layer deposition method thereof capable of increasing a throughput and productivity by simultaneously performing an atomic layer deposition on a plurality of semiconductor substrates. The uniformity of thin film can increase and thus a production yield increases. It may be easy to control the internal pressure of chamber and a pollution source, and the uniformity of thin film can increases and thus production yield may increase as well.

In accordance with an exemplary embodiment of the present invention, an atomic layer deposition apparatus is provided. The atomic layer deposition apparatus includes a reaction chamber, a heater which support a plurality of semiconductor substrates with a given interval within the reaction chamber and heats the plurality of semiconductor substrates; and a plurality of injectors respectively positioned within the reaction chamber and corresponding to the plurality of semiconductor substrates supported by the heater. The plurality of injectors are individually swept above the plurality of semiconductor substrates to spray reaction gas.

In accordance with an exemplary embodiment of the present invention, an atomic layer deposition apparatus is provided. The atomic layer deposition apparatus includes a reaction chamber for providing a space independent of the outside, a slit valve through which a plurality of semiconductor substrates are inserted from one side of the reaction chamber, a heater supported by a support axis positioned adjacent to a sidewall of another side of the reaction chamber opposite to the slit valve and the heater supporting a plurality of semiconductor substrates with a given interval in a center part of the reaction chamber. The atomic layer deposition apparatus further includes a plurality of vertical pipes positioned adjacent to an edge of the plurality of semiconductor substrates supported by the heater and connected between the inside and outside of the reaction chamber in parallel with the support axis of the heater, wherein the plurality of vertical pipes provide flowing reaction gas reacting on the plurality of semiconductor substrates, and a plurality of injectors positioned within the reaction chamber and individually connected above the plurality of semiconductor substrates in the plurality of vertical pipes. The plurality of injectors spray the reaction gas flowing through the plurality of vertical pipes onto the plurality of semiconductor substrates.

The plurality of vertical pipes and the plurality of injectors may be positioned corresponding to a vertex of square with the same or similar side length as a diameter of the plurality of semiconductor substrates. The plurality of vertical pipes and the plurality of injectors may comprise a plurality of first vertical pipes and a plurality of first injectors opposed mutually in a first diagonal direction of the square centering on the plurality of semiconductor substrates, and a plurality of second vertical pipes and a plurality of second injectors opposed mutually in a second diagonal direction crossed with the first direction.

In accordance with an exemplary embodiment of the present invention, an atomic layer deposition method is provided. The method includes placing a plurality of semiconductor substrates into a reaction chamber spraying source gas while a plurality of first injectors individually sweep above the plurality of semiconductor substrates, and thus exposing the surface of the plurality of semiconductor substrates to the source gas. The method further includes spraying oxidation reaction gas while a plurality of second injectors individually sweep above the plurality of semiconductor substrates exposed to the source gas, and thus forming an atomic layer thin film on the plurality of semiconductor substrates. In addition, the method further includes alternately spraying the source gas and the oxidation reaction gas while the plurality of first and second injectors sweep above the plurality of semiconductor substrates, and thus forming a number of atomic layer thin films on the plurality of semiconductor substrates. Moreover, the method further includes taking out the plurality of semiconductor substrates from the reaction chamber.

As described above, according to some exemplary embodiments of the present invention, an atomic layer deposition is performed simultaneously for a plurality of semiconductor substrates by using a plurality of first and second injectors spraying reaction gas during a separate sweeping above the plurality of semiconductor substrates, thereby increasing throughput and productivity.

The reaction gas is sprayed onto an entire face or substantially an entire face of the plurality of semiconductor substrates by using a plurality of first and second injectors sweeping above the plurality of semiconductor substrates, thereby enhancing the uniformity of thin film and thus increasing production yield.

The inside pressure and a pollution source can be easily controlled in the reaction chamber surrounding a heater through the heater individually heating and supporting the plurality of semiconductor substrates, thereby enhancing the uniformity of thin film formed in an atomic layer deposition process and increasing production yield.

BRIEF DESCRIPTION OF THE DRAWINGS

Exemplary embodiments of the present invention can be understood in more detail from the following description taken in conjunction with the attached drawings in which.

DETAILED DESCRIPTION OF THE EMBODIMENTS

Exemplary embodiments of the present invention now will be described more fully hereinafter with reference to the accompanied drawings, in which exemplary embodiments of the invention are shown. This invention may, however, be embodied in many different forms and should not be construed as being limited to the embodiments set forth herein.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein. Exemplary embodiments of the present invention are more fully described below with reference to the accompanied drawings. This invention may, however, be embodied in many different forms and should not be construed as being limited to the exemplary embodiments set forth herein. For purposes of clarity, a detailed description for well-known functions or configuration has been omitted.

Figure 1:
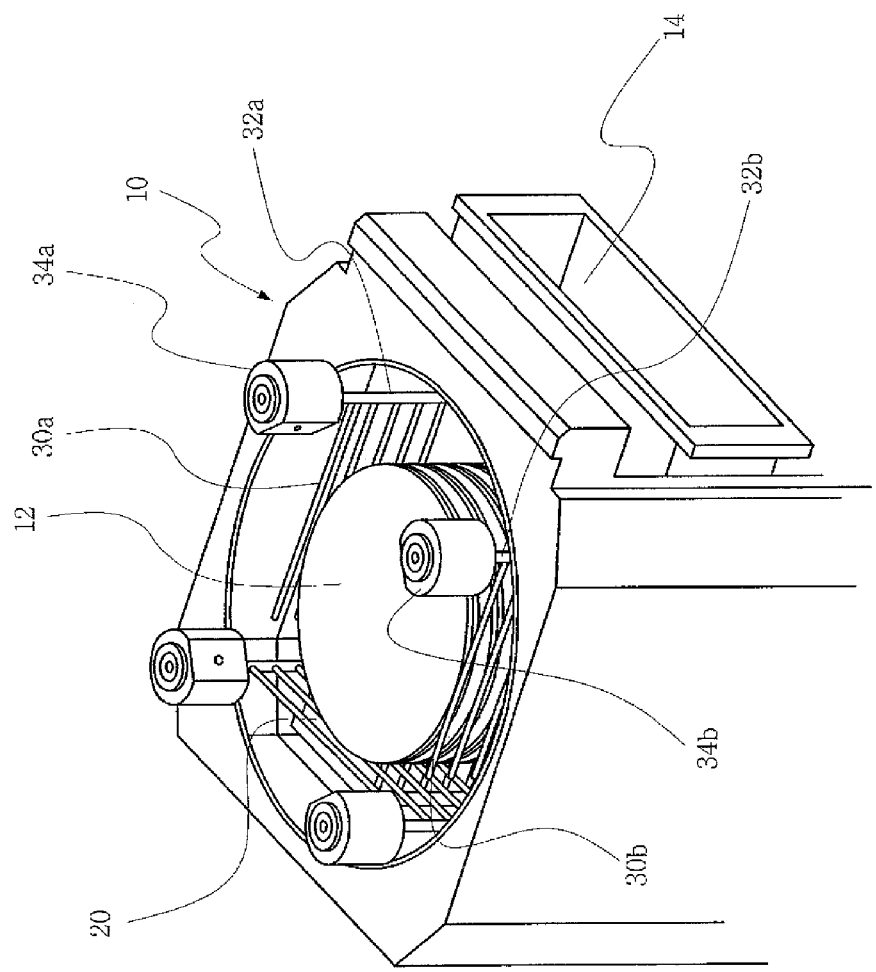
FIG. 1 is a perspective view schematically illustrating an atomic layer deposition equipment according to an exemplary embodiment of the invention.
Figure 2:
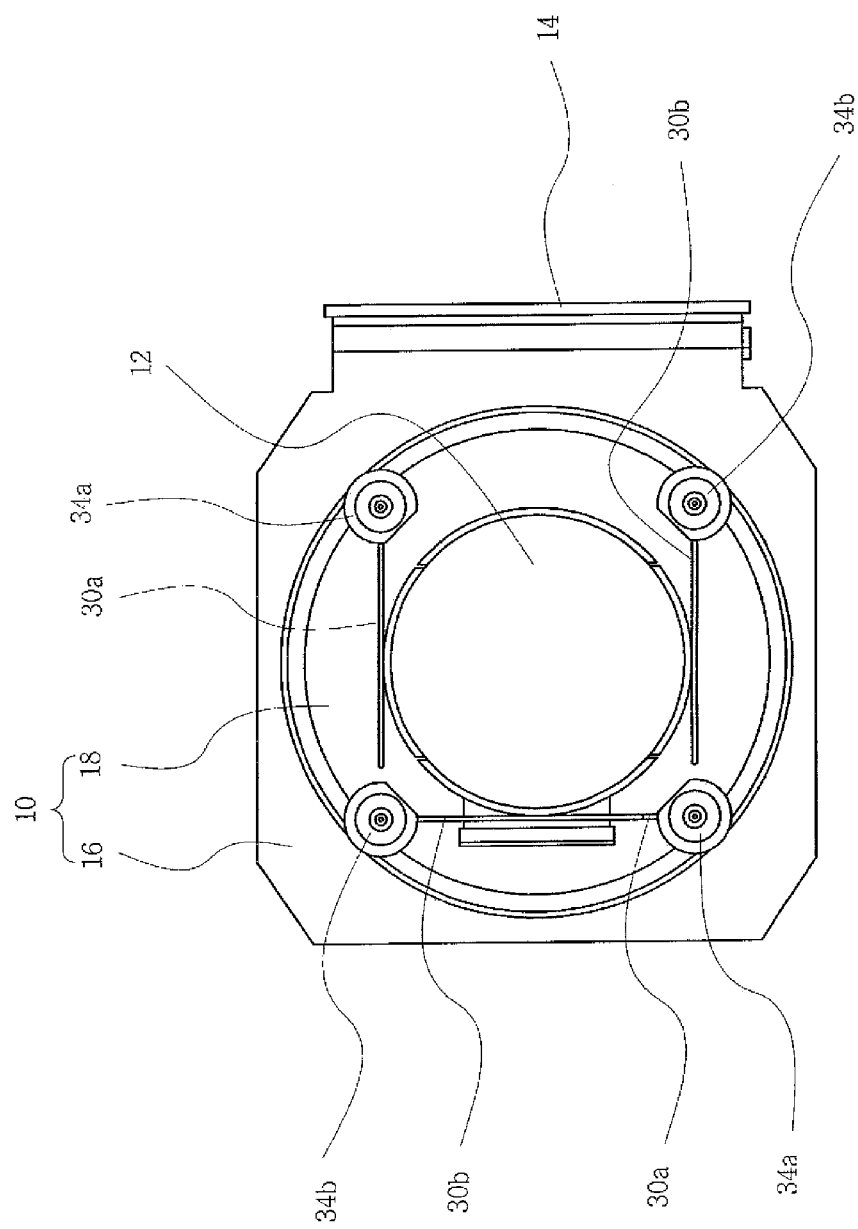
FIG. 2 is a plan view of FIG. 1.
Figure 3:
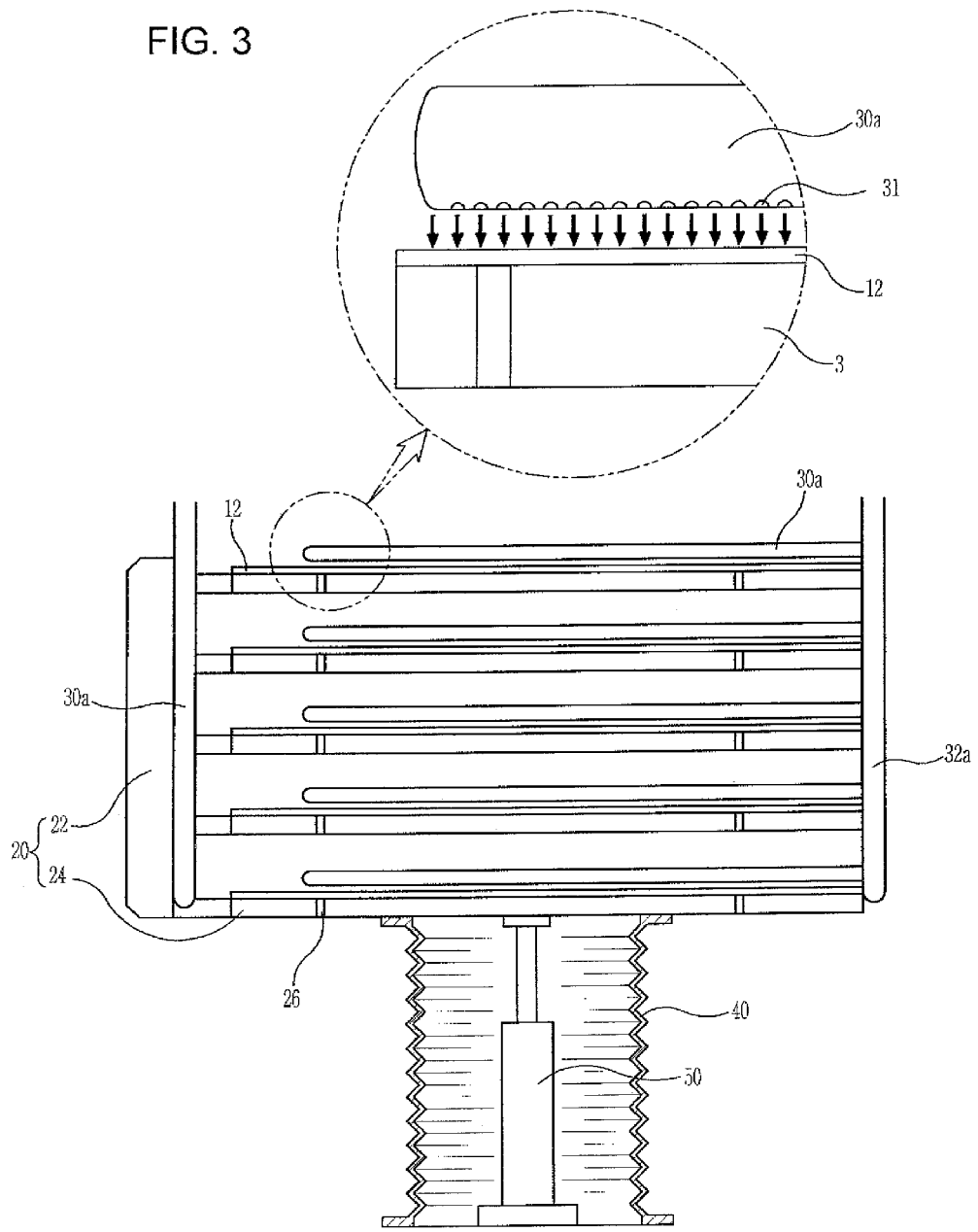
FIG. 3 is a sectional view illustrating heater and injector of FIG. 1.

FIG. 1 is a perspective view schematically illustrating an atomic layer deposition apparatus according to an exemplary embodiment of the invention. FIG. 2 is a plan view of FIG. 1. FIG. 3 is a sectional view illustrating a heater 20 and injector 30a, 30b of FIG. 1.

As shown in FIGS. 1 to 3, in an atomic layer deposition equipment according to an exemplary embodiment of the invention, a plurality of injectors 30a and 30b sweep between a plurality of semiconductor substrates 12 vertically stacked and supported by a heater 20 of a reaction chamber 10, and thus a reaction gas can be sprayed onto the plurality of respective semiconductor substrates 12.

The reaction chamber 10 provides an independent space airtight from the outside. Air inside the reaction chamber 10 may be pumped by a vacuum pump connected to an exhaust pipe coupled with a lower part so as to determine a low or high vacuum state. In addition, a plurality of reaction chambers 10 may be spread out in a cluster type and coupled with one another in the neighborhood centering on a transfer chamber to transfer the semiconductor substrates 12. The semiconductor substrate 12 can be loaded in the heater 20 of the reaction chamber 10 by, for example, a robot arm adapted in the transfer chamber.

At this time, the plurality of semiconductor substrates 12 can enter into and exit from the reaction chamber 10 through a slit valve 14 opened/closed between the reaction chamber 10 and the transfer chamber. For example, the reaction chamber 10 is formed including a body 16 to load a plurality of semiconductor substrates 12, and a lid 18 for covering an upper part of the body 16 and opened/closed in a normal state. The body 16 may be provided with a heating device and a cooling device for heating or cooling to a corresponding temperature the inside of the reaction chamber 10 through a reaction temperature of about 100° C. to about 600° C. Further, a plasma electrode for exciting reaction gas supplied to the inside of the body 16 to a plasma state by using radio frequency power supplied from the outside may also be provided.

A heater 20 is provided comprising a support axis 22 approximate to a sidewall of the reaction chamber 10 opposite to the slit valve 14, and a plurality of flat plates 24 supported by the support axis 22 and supporting a plurality of semiconductor substrates 12 with a given interval in the center part of the reaction chamber 10. The heater 20 may horizontally support the substrates by using the flat plates 24 such that, for example, the plurality of semiconductor substrates 12 are arrayed in a multistage stack structure with a given interval. The pluralities of flat plates 24 are a multi-slot supporting the plurality of respective semiconductor substrates 12. For example, the number of flat plates 24 may be five or more. The plurality of flat plates 24 may be opened entirely except for one side supported by the support axis 22, and thus a plurality of injectors 30a and 30b can individually sweep above the plurality of semiconductor substrates 12.

The heater 20 can vertically stack the plurality of semiconductor substrates 12 with a given interval, and thus the reaction chamber 10 may be provided extending in a vertical direction. Also, in the reaction chamber 10, air such as, for example, a reaction gas in the inside can be efficiently exhausted through an exhaust line provided under the heater 20 stacking and supporting the plurality of semiconductor substrates.

The plurality of flat plates 24 are provided to be raised or lowered by an elevator 50 provided in a lower center of the reaction chamber 10. The elevator 50 is protected from an inside vacuum of the reaction chamber 10 by using, for example, bellows 40. Further, in a girth of the elevator 50, a plurality of lifter pins are provided piercing through pin holes 26 formed on the plurality of flat plates 24 so as to float the plurality of semiconductor substrates 12 above the plurality of flat plates 24.

For example, the plurality of lifter pins are provided as three lifter pins to correspond to vertexes of a triangle having a center corresponding to the center of the semiconductor substrate 12. Thus, the plurality of lifter pins may be provided to sequentially load semiconductor substrates 12 of from an uppermost part to a lowermost part of the plurality of flat plates 24 and again sequentially float the plurality of the semiconductor substrates 12 from a lowermost part to an uppermost part of the plurality of flat plates 24.

Further, the plurality of flat plates 24 are provided to heat the plurality of semiconductor substrates 12 to temperature of about 100° C. to about 700° C. This is why the atomic layer deposition process can be obtained when the plurality of semiconductor substrates 12 are heated to the same temperature as or a similar temperature to a reaction gas of high temperature by using the plurality of flat plates 24. The pluralities of flat plates 24 are formed with the same or a similar size to the plurality of semiconductor substrates 12. For example, the pluralities of flat plates 24 are provided including a plurality of coils or thermocouple heating the plurality of semiconductor substrates 12.

Accordingly, with the atomic layer deposition apparatus according to an exemplary embodiment of the invention, the inside pressure and the pollution source can be readily controlled through reaction chamber 10 surrounding the heater 20 by using, for example, the heater 20 individually heating and supporting the plurality of semiconductor substrates 12. Consequently, the uniformity of thin film formed through the atomic layer deposition process can increase and thus the production yield may increase.

On the other hand, a plurality of injectors 30a and 30b sweeping above the plurality of semiconductor substrates 12 supported by the plurality of flat plates 24 are coupled with a plurality of vertical pipes 32a and 32b inserted into the interior from the outside of the reaction chamber 10.

Additionally, a reaction gas supply part for supplying reaction gas of a given pressure to the plurality of vertical pipes 32a and 32b may be provided outside of the reaction chamber 10. The plurality of injectors 30a and 30b are formed in, for example, a comb shape individually passing between the plurality of semiconductor substrates 12, and spraying reaction gas onto the plurality of semiconductor substrates 12. The reaction gas is supplied through the plurality of vertical pipes 32a and 32b adjacent to the edge of the plurality of semiconductor substrates 12. In the plurality of injectors 30a and 30b, a plurality of spray holes 31 for individually discharging reaction gases above the plurality of semiconductor substrates 12 are formed in a lower direction. Thus, the plurality of vertical pipes 32a and 32b may be provided to rotate with a given azimuth angle so that the plurality of injectors 30a and 30b can pass between the semiconductor substrates 12. At this time, the plurality of vertical pipes 32a and 32b rotate by a rotary body 34a, 34b transferring a rotary force transferred from a rotation device of the outside. The plurality of rotary bodies 34a and 34b are fastened to the lid 18 provided in an upper part of the reaction chamber 10.

For example, the plurality of rotary bodies 34a and 34b and the plurality of vertical pipes 32a and 32b are positioned corresponding to a vertex of square with four regular intervals centering on the semiconductor substrate 12. The plurality of rotary bodies 34a and 34b are provided including a plurality of first rotary bodies 34a provided in a first diagonal direction of the square, and a second rotary body 34b provided in a second diagonal direction crossed to the first diagonal direction. Further, the pluralities of vertical pipes are provided including a plurality of first vertical pipes 32a provided in first direction, and a plurality of second pipes 32b provided in second direction. Thus, the plurality of first vertical pipes 32a are coupled with the plurality of first injectors 30a for spraying reaction gas to the semiconductor substrates 12, and the plurality of second vertical pipes 32b are coupled with the plurality of second injectors 30b. The number of first or second injectors 30a or 30b may be the same as that of flat plates 24 of the heater 20.

Here, the plurality of first injectors 30a provided with the plurality of first vertical pipes 32a have a shorter distance than the distance from the plurality of second vertical pipes 32b. Similarly, the plurality of second injectors 30b provided with the plurality of second vertical pipes 32b are provided with a shorter distance than the distance from the plurality of first vertical pipes 32a. This is why in an opened step of the lid 18 of the reaction chamber 10 that the plurality of first and second injectors 32a and 32b are fastened to each other, the plurality of first and second injectors 30a and 30b are not interfered by the flat plate 24 of the heater 20.

The plurality of first and second injectors 30a and 30b are formed to have a length from the edge of the plurality of semiconductor substrates 12 to the center of the plurality of semiconductor substrates 12, or longer length. Thus, the plurality of first and second injectors 30a and 30b individually sweep above the semiconductor substrates 12, and spray reaction gases. Here, to prevent a collision between the plurality of first and second injectors 30a and 30b and semiconductor substrates 12 entering into the reaction chamber 10 through the slit valve 14, the plurality of first and second injectors 30a and 30b may be positioned in three sides except one side approximate to the slit valve 14 among the four sides of the square. Here, the first and second injectors 30a and 30b may have different heights so as to overlay the first injector 30a positioned adjacent to the support axis 22 to the second injector 30b.

The atomic layer deposition apparatus according to an exemplary embodiment of the invention simultaneously performs an atomic layer deposition of a number of semiconductor substrates 12 by using the plurality of first and second injectors 30a and 30b spraying reaction gas while the plurality of semiconductor substrates 12 are individually swept, thereby increasing throughput and productivity.

Figure 4:
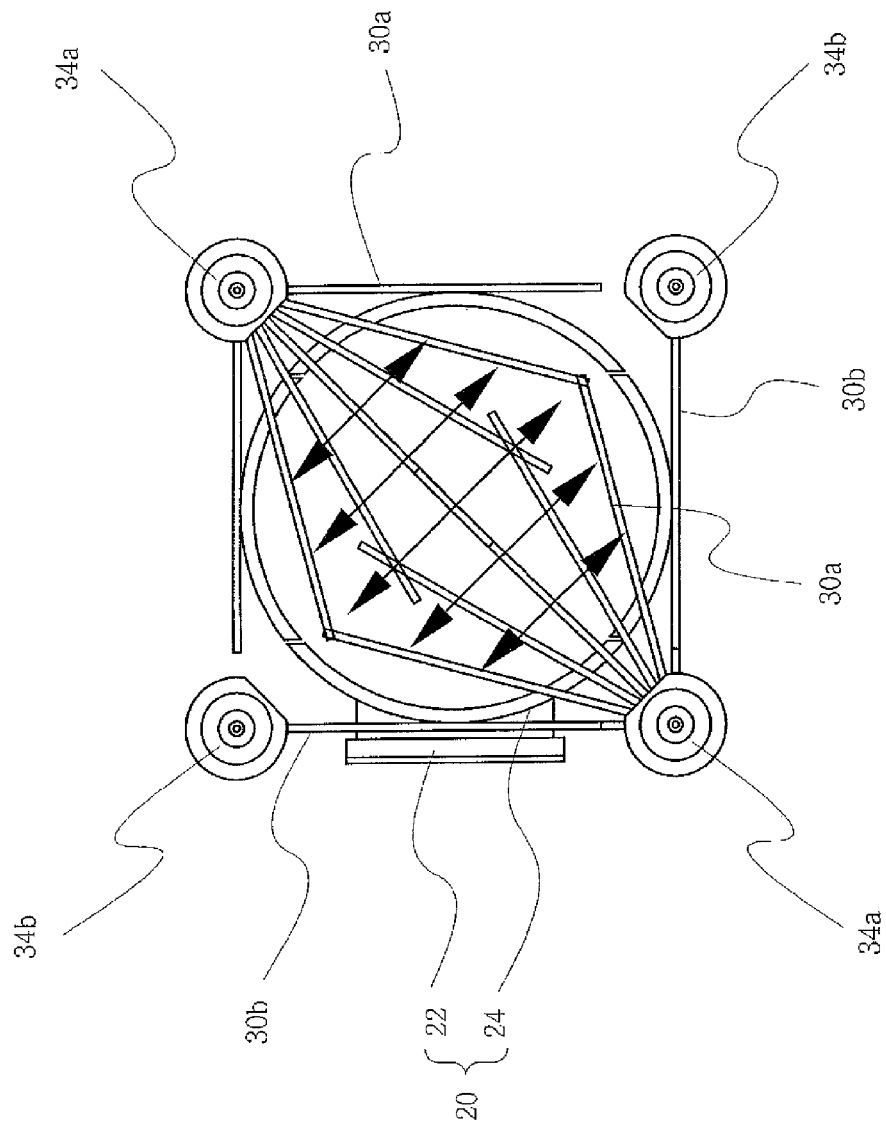
FIG. 4 is a plan view illustrating a sweeping of a plurality of first injectors.

FIG. 4 is a plan view illustrating a sweeping of the plurality of first injectors 30a and 30b. The plurality of first injectors 30a are provided to spray reaction gas and form a track corresponding to a circular arc by a rotation of the plurality of first vertical pipes 32a opposite to one another centering on the semiconductor substrate 12. The plurality of first vertical pipes 32a rotating the plurality of first injectors 30a rotate with an azimuth angle of about 90°. Further, to sweep the semiconductor substrates 12 individually by the plurality of first injectors 30a, the plurality of first vertical pipes 32a should rotate in mutually opposite directions. For example, when any one of the plurality of first injectors 30a rotates clockwise, the rest one rotates in a counterclockwise direction, thereby sweeping an entire face or substantially an entire face of the semiconductor substrate 12.

The plurality of first injectors 30a rotate within about 90° of the interior angle of the square on the rotary axis of the plurality of first vertical pipes 32a. At this time, an edge part of semiconductor substrate 12 adjacent to the plurality of first vertical pipes 32a is swept by the plurality of first injectors 30a at a slower speed as compared with the center part. That is, the plurality of first injectors 30a sweep fast at the center part of the semiconductor substrate 12 as compared with the edge part. The plurality of first injectors 30a can sweep at a fast speed corresponding to a length of arrow shown in FIG. 4. Thus, the plurality of first injectors 30a spray sufficient reaction gas onto an edge small-area of the semiconductor substrate 12, and spray insufficient reaction gas onto a relatively wide area of the center part of semiconductor substrate 12.

If two first injectors 30a facing each other do not overlap each other over the central part of a corresponding semiconductor substrate 12, reaction gas is not uniformly sprayed onto the entire surface of the corresponding semiconductor substrate 12. For this reason, the plurality of first injectors 30a each are configured to have a length greater than the distance between a corresponding first vertical pipe 32a and a center of a corresponding semiconductor substrate 12 such that two first injectors 30a facing each other can overlap each other over the central part of a corresponding semiconductor substrate 12.

Also, a plurality of second injectors 30b may have the same or similar length to the plurality of first injectors 30a, to sweep an entire face or substantially an entire face of semiconductor substrate 12 in a similar method.

Accordingly, in an atomic layer deposition apparatus according to an exemplary embodiment of the invention, the reaction gas is sprayed onto an entire face or substantially an entire face of the plurality of semiconductor substrates 12 by using the plurality of first and second injectors 30a and 30b sweeping the upper part of the plurality of semiconductor substrates 12, thereby increasing the uniformity of thin film and the production yield.

The plurality of first and second injectors 30a and 30b can individually sweep an entire face or substantially an entire face of semiconductor substrate 12, and thus an atomic layer deposition process using not only reaction gas of a second element but also reaction gas of third or more elements can be performed.

For example, the plurality of first injectors 30a spray reaction gas onto an entire face or substantially an entire face of the semiconductor substrates 12. The reaction gas may being obtained by composing source gases such as, for example, TMA (Tri Methyl Aluminum), DMAH (Di Methyl Aluminum Hydride), DMAH-EPP (DiMethyl Aluminum Hydride Ethyl Piperidine), TEMAH (Tetrakis EthylMethylAmino Hafnium), TDEAH (Tetrakis DiEthylAmino Hafnium), TDMAH (Tetrakis DiMethylAmino Hafnium), TEMAZ (Tetrakis EthylMethylAmino Zirconium), TDEAZ (Tetrakis DiEthylAmino Zirconium), TDMAZ (Tetrakis DiMethylAmino Zirconium), silane, ammonia etc. On the other hand, the second injector 30b) may spray an oxidation reaction gas such as, for example, nitrous oxide ($N_2O$), nitrogen oxide (NO), nitrogen dioxide ($NO_2$), and ozone ($O_3$) onto an entire face or substantially an entire face of the semiconductor substrate 12. At this time, the plurality of first and second injectors 30a and 30b may each spray purge gas or inactive gas such as, for example, nitrogen ($N_2$), argon (Ar), helium (He), krypton (Kr), xenon (Xe).

Therefore, in an atomic layer deposition equipment according to an exemplary embodiment of the invention, a plurality of first injectors 30a and a plurality of second injectors 30b sweep above a plurality of semiconductor substrates 12 stacked by flat plates 24 of heater 20, and respectively, alternately, spray a source gas and an oxidation reaction gas, thereby forming an atomic layer thin film.

An atomic layer deposition method using an atomic layer deposition apparatus of the invention is described as follows.

Figure 5:
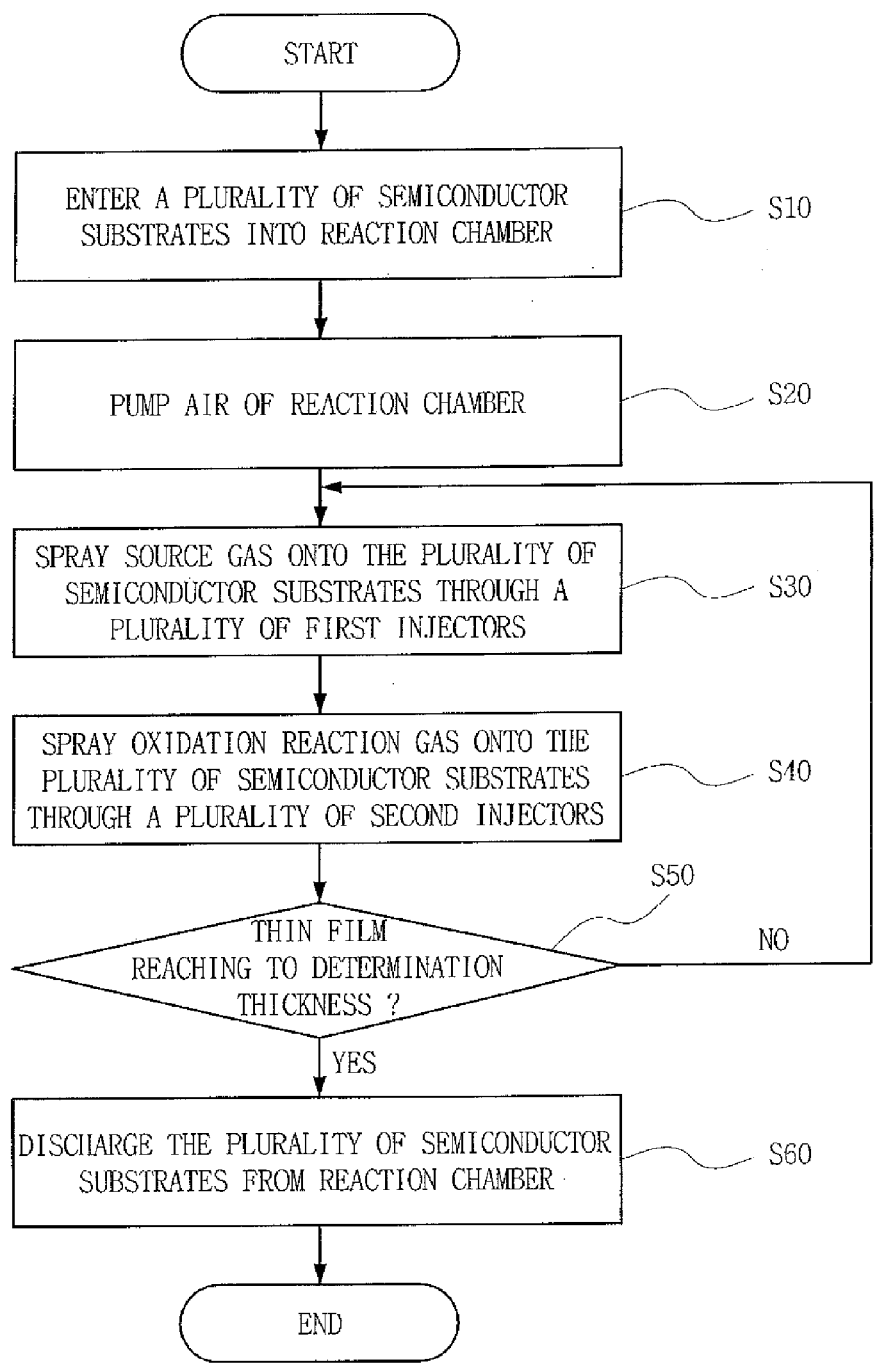
FIG. 5 is a flowchart providing an atomic layer deposition method according to an exemplary embodiment of the invention.

FIG. 5 is a flowchart providing an atomic layer deposition method according to an exemplary embodiment of the invention.

As shown in FIG. 5, in the atomic layer deposition method, first, a plurality of semiconductor substrates 12 enter into a reaction chamber 10 in step S10. Here, the reaction chamber 10 may be connected to a transfer chamber in a state in which the slit valve 14 is opened. Thus, the plurality of semiconductor substrates 12 may be loaded one sheet by one sheet in heater 20 of the reaction chamber 10 by, for example, a robot arm provided with the transfer chamber. As described above, the plurality of semiconductor substrates 12 may be loaded sequentially into an uppermost flat plate 24 to a lowermost flat plate 24 of the heater 20.

Then, air inside the reaction chamber 10 may be pumped by a given pressure. Here, when the loading of the plurality of semiconductor substrates 12 is completed, the slit valve 14 is closed and thus the reaction chamber 10 is sealed up. And then, the state inside of the reaction chamber 10 becomes a high vacuum state of about $1\times10^{-6}$ Torr by exhausting air through an exhaust pipe connected to the reaction chamber 10, then the state inside of the reaction chamber becomes a low vacuum state of about $1\times10^{-3}$ Torr, in step S20. Consequently, as a result, air acting as a pollution source inside the reaction chamber 10 is substantially reduced and reproducibility of the atomic layer deposition process is obtained. At this time, a purge gas or an inactive gas having a high purity may be supplied in a very small amount into the reaction chamber 10 to keep a stable vacuum state for the reaction chamber 10. A plasma electrode may excite the purge gas or inactive gas to a plasma state to induce a plasma reaction inside the reaction chamber 10. Further, the heater 20 heats the semiconductor substrate 12 to about 100° C. to about 700° C. Thus, air inside the reaction chamber 10 is exhausted, and a preparatory process to form an atomic layer thin film in a subsequent process is performed.

Next, a thin film with a given thickness is formed on a plurality of semiconductor substrates 12 by using reaction gas sprayed from the plurality of first and second injectors 30a and 30b. Here, the kind of reaction gases sprayed from the plurality of first and second injectors 30a and 30b may become different according to a kind of thin films being formed on the plurality of semiconductor substrates 12.

For example, the kinds of thin films which may be formed on the plurality of semiconductor substrates 12 may be formed of materials such as hafnium oxide, zirconium oxide, aluminum oxide, titanium oxide, tantalum oxide, lanthanum oxide, praseodymium oxide, tungsten oxide, niobium oxide, molybdenum oxide, strontium oxide, barium oxide, ruthenium oxide, iridium oxide and silicon oxide.

For example, when the thin film is an aluminum oxide, a source gas of, for example, TMA (Tri Methyl Aluminum), DMAH (Di Methyl Aluminum Hydride), DMAH-EPP (DiMethyl Aluminum Hydride Ethyl Piperidine) etc. may be used. Further, when the thin film is hafnium oxide, TEMAH (Tetrakis EthylMethylAmino Hafnium), TDEAH (Tetrakis DiEthylAmino Hafnium), TDMAH (Tetrakis DiMethylAmino Hafnium) etc. may be used. And, when the thin film is zirconium oxide, a source gas such as, for example, TEMAZ (Tetrakis EthylMethylAmino Zirconium), TDEAZ (Tetrakis DiEthylAmino Zirconium), TDMAZ (Tetrakis DiMethylAmino Zirconium) etc. may be used. Also, an oxidation reaction gas, such as, for example, $N_2O$, $NO$, $NO_2$, $O_3$ may be supplied alternately with the source gas into the reaction chamber.

The plurality of first injectors 30a spray source gas onto the plurality of semiconductor substrates 12, sweeping the upper part of the plurality of semiconductor substrates 12, in step S30. At this time, the source gas is covered or chemically sucked onto an entire face or substantially an entire surface of semiconductor substrate 12 exposed to source gas. The plurality of first injectors 30a can remove source gas not contacted with the surface of the plurality of semiconductor substrates 12 by spraying a purge gas or an inactive gas onto the plurality of semiconductor substrates 12.

And then, a plurality of second injectors 30b spray oxidation reaction gas onto an entire face or substantially an entire face of the plurality of semiconductor substrates 12, sweeping above the plurality of semiconductor substrates 12, in step S40. The oxidation reaction gas can form a single atomic layer thin film on the plurality of semiconductor substrates 12, and further a ligand is removed to float from the surface of the semiconductor substrate 12 and be exhausted. Similarly, the plurality of second injectors 30b may spray a purge gas or an inactive gas onto the plurality of semiconductor substrates 12 on which an atomic layer thin film has been formed, thereby removing remaining oxidation reaction gas. Accordingly the plurality of first and second injectors 30a and 30b can individually spray source gas and oxidation reaction gas, thereby forming an atomic layer thin film of a multilayer structure or a number of atomic layer thin films.

At this time, the plurality of first and second injectors 30a and 30b can each spray not only a single kind of source gas and oxidation reaction gas onto the semiconductor substrate 12, but also mutually different kinds of source gas and oxidation reaction gas. The plurality of first and second injectors 30a and 30b can separately spray source gas and oxidation reaction gas, and thus various kinds of source gases and oxidation reaction gases may readily flow on the plurality of semiconductor substrates 12.

Accordingly, in an atomic layer deposition method according to an exemplary embodiment of the invention, the plurality of first and second injectors 30a and 30b spray source gas and oxidation reaction gas onto the plurality of semiconductor substrates 12 during individually sweeping an entire face of the plurality of semiconductor substrates 12, thereby enhancing the uniformity and a throughput of the atomic layer thin film and thus increasing a production yield. Then, when the atomic layer thin film of a given thickness is formed on the plurality of semiconductor substrates 12, purge gas or inactive gas is filled inside the reaction chamber 10, in step S50.

Finally the pluralities of semiconductor substrates 12 completed in the atomic layer deposition process inside the reaction chamber 10 are discharged in step S60. The discharge of the plurality of semiconductor substrates 12 is performed in an inverse sequence of the loading. For example, the slit valve 14 is opened to connect the reaction chamber 10 to the transfer chamber. The plurality of semiconductor substrates 12 are taken out of the heater 20 of the reaction chamber 10 by using, for example, a robot arm provided with the transfer chamber. At this time, the plurality of semiconductor substrates 12 can be sequentially taken out of from a lowermost part to an uppermost part of the heater 20.

Accordingly, in an atomic layer deposition method according to an exemplary embodiment of the invention, an atomic layer thin film can be formed at a time on a plurality of semiconductor substrates 12 through one atomic layer deposition process inside the reaction chamber 10, thereby increasing throughput.

Having described the exemplary embodiments of the present invention, it is further noted that it is readily apparent to those of reasonable skill in the art that various modifications may be made without departing from the spirit and scope of the invention which is defined by the metes and bounds of the appended claims.

What is claimed is:

1. An atomic layer deposition method comprising:
    placing a plurality of semiconductor substrates into a reaction chamber;
    spraying source gas while a pluralities of first injectors individually sweep above the plurality of semiconductor substrates, and thus exposing the surface of the plurality of semiconductor substrates to the source gas;
    spraying oxidation reaction gas while a plurality of second injectors individually sweep above the plurality of semiconductor substrates exposed to the source gas, and thus forming an atomic layer thin film on the plurality of semiconductor substrates;
    alternately spraying the source gas and the oxidation reaction gas while the plurality of first and second injectors sweep above the plurality of semiconductor substrates, and thus forming a number of atomic layer thin films on the plurality of semiconductor substrates; and taking out the plurality of semiconductor substrates from the reaction chamber.

2. The method of claim 1, further comprising spraying one of a purge gas or an inactive gas after spraying the source gas or oxidation reaction gas from the plurality of first and second injectors.

3. The method of claim 1, wherein the plurality of first and second injectors individually spray a single kind of source gas and oxidation reaction gas onto the semiconductor substrate, or individually spray mutually different kinds of source gases and oxidation reaction gases.

4. The method of claim 1, wherein the source gas sprayed from the plurality of first injectors comprises at least one of Tri-Methyl Aluminum (TMA), Di-Methyl Aluminum Hydride (DMAH), DiMethyl Aluminum Hydride Ethyl Piperidine (DMAH-EPP), Tetrakis EthylMethyl Amino Hafnium (TEMAH), Tetrakis DiethylAmino Hafnium (TDEAH), Tetrakis DiMethylAmino Hafnium (TDMAH), Tetrakis EthylMethylamino Zirconium (TEMAZ), Tetrakis DiethylAmino Zirconium (TDEAZ) and Tetrakis DiMethylAmino Zirconium (TDMAZ), and the oxidation reaction gas sprayed from the plurality of second injectors comprises at least one of nitrous oxide ($N_2O$), nitrogen oxide (NO), nitrogen dioxide ($NO_2$) and ozone ($O_3$).

* * * * *